(12) United States Patent
Chen et al.

(10) Patent No.: US 10,325,786 B1
(45) Date of Patent: Jun. 18, 2019

(54) DOUBLE-SIDED PLASTIC FAN-OUT PACKAGE STRUCTURE HAVING ANTENNA AND MANUFACTURING METHOD THEREOF

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN); Chengtar Wu, Jiangyin (CN); Jangshen Lin, Jiangyin (CN)

(73) Assignee: SJ SEMICONDUCTOR (JIANGYIN) CORPORATION, JiangYin (CN)

( * ) Notice: Subject to any disclaimer, the term of this patent is extended or adjusted under 35 U.S.C. 154(b) by 0 days.

(21) Appl. No.: 15/923,337

(22) Filed: Mar. 16, 2018

(30) Foreign Application Priority Data

Dec. 7, 2017 (CN) .......................... 2017 1 1281899
Dec. 7, 2017 (CN) ..................... 2017 2 1686213 U (51) Int. Cl.
*H01L 21/56* (2006.01)
*H01L 23/66* (2006.01)
(Continued)

(52) U.S. Cl.
CPC ........ *H01L 21/568* (2013.01); *H01L 21/4853* (2013.01); *H01L 21/565* (2013.01); *H01L 23/3114* (2013.01); *H01L 23/3128* (2013.01); *H01L 23/5386* (2013.01); *H01L 23/5389* (2013.01); *H01L 23/66* (2013.01); *H01L 24/19* (2013.01); *H01L 24/20* (2013.01); *H01Q 1/2283* (2013.01); *H01L 2223/6677* (2013.01); *H01L 2224/214* (2013.01)

(58) Field of Classification Search
CPC . H01L 21/568; H01L 21/565; H01L 23/5226; H01L 2021/6006; H01L 2224/03001; H01L 2224/03002; H01L 2224/0231; H01L 2224/0233; H01L 2224/02331; H01L 2224/02333
See application file for complete search history.

(56) References Cited

U.S. PATENT DOCUMENTS

9,230,926 B2 * 1/2016 Seler .................. H01L 23/60
9,252,491 B2 * 2/2016 Liu .................... H01Q 9/0407
(Continued)

*Primary Examiner* — Jose R Diaz
(74) *Attorney, Agent, or Firm* — Alston & Bird LLP (57) ABSTRACT

The application provides a double-sided plastic fan-out package structure having an antenna structure. It includes a redistribution layer (RDL); a semiconductor chip, invertedly mounted on a first surface of the redistribution layer with a front surface facing downward; a first plastic encapsulation material layer, located on the first surface of the redistribution layer, encapsulating the semiconductor chip; a second plastic encapsulation material layer, located on a second surface of the redistribution layer; an antenna structure, located on a surface of the second plastic packaging material layer distant from the redistribution layer; an electrical connection structure, located inside the second plastic encapsulation material layer, and electrically connected to the antenna structure on the lower side of the redistribution layer. This structure can shield an interference signal of the antenna structure, thereby preventing the antenna structure from interfering the semiconductor chip.

9 Claims, 7 Drawing Sheets

(51) Int. Cl.
*H01L 23/31* (2006.01)
*H01L 23/538* (2006.01)
*H01L 23/00* (2006.01)
*H01L 21/48* (2006.01)
*H01Q 1/22* (2006.01)

(56) References Cited

U.S. PATENT DOCUMENTS 9,431,369 B2 * 8/2016 Chih .................... H01Q 1/2283
2011/0133341 A1 * 6/2011 Shimizu .............. H01L 23/3185
257/773

* cited by examiner

FIG. 17

DOUBLE-SIDED PLASTIC FAN-OUT PACKAGE STRUCTURE HAVING ANTENNA AND MANUFACTURING METHOD THEREOF

CROSS REFERENCE TO RELATED APPLICATIONS

This application claims priority to Chinese Patent Applications No. CN2017112818999 and CN201721686213X, filed on Dec. 7, 2017, the entire content of which is incorporated herein by reference.

TECHNICAL FIELD

The present disclosure relates to the field of semiconductor packaging technologies, and in particular, to a double-sided plastic fan-out package structure having an antenna structure and a manufacturing method thereof.

BACKGROUND

The goal of integrated circuit packaging is to provide more reliable circuits with lower costs, faster speed, and higher density. In the future, for the integrated circuit packaging, the integration density of various electronic components will be constantly improved by reducing the minimum feature size. Currently, the advanced packaging methods include wafer level chip scale packaging (WLCSP), fan-out wafer level packaging (FOWLP), flip chips (FC), package on package (POP), and the like.

The FOWLP is a wafer level built-in chip packaging method, and is one of the advanced packaging methods having a relatively large amount of input/output (I/O) ports and good integration flexibility. Compared with conventional wafer level packaging, the FOWLP has unique advantages: ① The I/O spacing is flexible and does not rely on chip sizes. ② Only effective dies are used, which improves the product yield. ③ The FOWLP has a flexible three dimensional (3D) package path, that is, any array pattern may be formed on the top. ④ The electrical performance and thermal performance are good. ⑤ The FOWLP may be applied in high frequency applications. ⑥ High-density wiring is easy to implement on a redistribution layer (RDL).

In an existing fan-out package structure having an antenna, the antenna and a semiconductor chip are packaged and connected to each other by using a substrate. Moreover, an electrical connection structure between various metal layers in the package structure is formed by using an exposing electroplating process. The fan-out package structure having an antenna has the following problems: the package structure has a relatively large size and relatively high costs, and the performance of the package structure is affected due to a relatively large height of the electrical connection structure.

SUMMARY

The present disclosure provides a double-sided plastic fan-out package structure having an antenna structure. The double-sided plastic fan-out package structure having an antenna structure comprises:

a redistribution layer, comprising a first surface and a second surface opposite to each other;

a semiconductor chip, invertedly mounted on the first surface of the redistribution layer with a front surface facing downward, and electrically connected to the redistribution layer;

a first plastic encapsulation material layer, located on the first surface of the redistribution layer, and encapsulating the semiconductor chip;

a second plastic encapsulation material layer, located on the second surface of the redistribution layer;

an antenna structure, located on a surface of the second plastic encapsulation material layer distant from the redistribution layer;

an electrical connection structure, located inside the second plastic encapsulation material layer, wherein one end of the electrical connection structure is electrically connected to the redistribution layer, and the other end of the electrical connection structure is electrically connected to the antenna structure;

a connection through hole, located inside the first plastic encapsulation material layer, and on which the first surface of the redistribution layer is partially exposed; and a solder bump, located inside the connection through hole, and electrically connected to the redistribution layer.

Preferably, the antenna structure comprises a metal antenna layer.

Preferably, the antenna structure comprises at least two metal antenna layers stacked and spaced in a vertical direction, and two adjacent metal antenna layers are electrically connected by using a metal lead.

Preferably, the antenna structure further comprises a dielectric layer, the dielectric layer is at least located between the two adjacent metal antenna layers.

Preferably, the metal antenna layer is a helical antenna, and an orthographic projection of the helical antenna on a surface on which the semiconductor chip is located is located on a periphery of the semiconductor chip.

Preferably, the metal antenna layer comprises a plurality of antenna units, the plurality of antenna units is arranged in a circle in a direction parallel to the surface of the second plastic packaging material layer distant from the redistribution layer, and an orthographic projection of the metal antenna layer on the surface on which the semiconductor chip is located is located on a periphery of the semiconductor chip.

Preferably, the antenna units comprise block antennas or helical antennas.

Preferably, the electrical connection structure comprises a metal lead.

The present disclosure further provides a method for manufacturing a double-sided plastic fan-out package structure having an antenna. The method for manufacturing a double-sided plastic fan-out package structure having an antenna structure comprises the following steps:

1) providing a substrate, and forming a strip-off layer on the substrate;

2) providing a semiconductor chip, wherein the semiconductor chip is mounted on the peel-off layer with a front surface facing downward;

3) forming a first plastic encapsulation material layer on the strip-off layer, wherein the first plastic encapsulation material layer encapsulates the semiconductor chip;

4) removing the substrate, wherein the front surface of the semiconductor chip is exposed on a surface of the first plastic encapsulation material layer;

5) forming a redistribution layer on the surface of the first plastic encapsulation material layer on which the front facet of the semiconductor chip is exposed, wherein the redistribution layer comprises a first surface and a second surface opposite to each other, and the first surface of the redistribution layer is in contact with a surface of the first plastic encapsulation material layer;

6) forming an electrical connection structure on the second surface of the redistribution layer, wherein the bottom of the electrical connection structure is electrically connected to the redistribution layer;

7) forming a second plastic encapsulation material layer on the second surface of the redistribution layer, wherein the second plastic encapsulation material layer encapsulates the electrical connection structure, and the top of the electrical connection structure is exposed on a surface of the second plastic packaging material layer distant from the redistribution layer;

8) forming an antenna structure on the surface of the second plastic encapsulation material layer distant from the redistribution layer, wherein the antenna structure is electrically connected to the top of the electrical connection structure; and 9) forming a solder bump inside the first plastic encapsulation material layer, wherein the solder bump is electrically connected to the redistribution layer.

Preferably, in step 8), a specific method for forming the antenna structure on the surface of the second plastic encapsulation material layer distant from the redistribution layer is: forming a metal antenna layer on the surface of the second plastic encapsulation material layer and from the redistribution layer, and using the metal antenna layer as the antenna structure.

Preferably, step 8) of forming an antenna structure on the surface of the second plastic packaging material layer distant from the redistribution layer comprises the following steps:

8-1) forming a first metal antenna layer on the surface of the second plastic encapsulation material layer distant from the redistribution layer;

8-2) forming a first metal lead on the first metal antenna layer, wherein the bottom of the first metal lead is electrically connected to the first metal antenna layer;

8-3) forming a first dielectric layer on the surface of the second plastic packaging material layer distant from the redistribution layer, wherein the first dielectric layer completely covers the first metal antenna layer and the first metal lead, and the top of the first dielectric layer is aligned with the top of the first metal lead; and 8-4) forming a second metal antenna layer on a surface of the first dielectric layer.

Preferably, after step 8-4), the method further comprises the following steps:

8-5) forming a second metal lead on the second metal antenna layer formed in step 8-4), wherein the bottom of the second metal lead is electrically connected to the second metal antenna layer formed in previous step 8-4);

8-6) forming a second dielectric layer on the surface of the first dielectric layer formed in step 8-3), wherein the second dielectric layer completely covers the second metal antenna layer formed in step 8-5) and the second metal lead that are formed in step 8-5), and the top of the second dielectric layer formed in this step is aligned with the top of the second metal lead; and 8-7) forming a third metal antenna layer on a surface of the second dielectric layer formed in step 8-6).

Preferably, after step 8-7), the method further comprises: repeating step 8-5) to step 8-7) at least once.

Preferably, the metal antenna layer is a helical antenna, and an orthographic projection of the metal antenna layer on a surface on which the semiconductor chip is located is located on a periphery of the semiconductor chip.

Preferably, the metal antenna layer comprises a plurality of antenna units, the plurality of antenna units is arranged in a circle in a direction parallel to the surface of the second plastic packaging material layer distant from the redistribution layer, and an orthographic projection of the metal antenna layer on the surface on which the semiconductor chip is located is located on a periphery of the semiconductor chip.

Preferably, the antenna units comprise block antennas or helical antennas.

Preferably, step 9) of forming a solder bump inside the first plastic encapsulation material layer comprises the following steps:

9-1) forming a connection through hole inside the first plastic packaging material layer, wherein the first surface of the redistribution layer is partially exposed on the connection through hole; and 9-2) forming the solder bump inside the connection through hole, wherein the solder bump is electrically connected to the redistribution layer.

As described above, the double-sided plastic fan-out package structure having an antenna structure and the manufacturing method thereof consistent with the present disclosure have the following beneficial effects: the semiconductor chip and the antenna structure in the double-sided plastic fan-out package structure having an antenna structure consistent with the present disclosure are respectively located on an upper side and a lower side of the redistribution layer, and a metal wire layer in the redistribution layer can shield an interference signal of the antenna structure, thereby preventing the antenna structure from interfering the semiconductor chip; the metal lead formed between the antenna structure and the redistribution layer by using the electrical connection structure and a wiring process can effectively reduce the costs, and effectively shorten the spacing between the antenna structure and the redistribution layer, thereby improving the component performance; the double-sided plastic fan-out package structure having an antenna structure consistent with the present disclosure further has an advantage of a small size.

BRIEF DESCRIPTION OF THE DRAWINGS

FIG. 2 to FIG. 17 illustrate schematic structural diagrams of various steps in making a double-sided plastic fan-out package structure having an antenna structure according to Embodiment 1 of the present disclosure, wherein

| Description of Component Reference Numerals | |
|---|---|
| 10 | Substrate |
| 11 | Strip-off layer |
| 12 | Semiconductor chip |
| 121 | Bare chip |
| 122 | Connection pad |
| 13 | First plastic encapsulation material layer |
| 131 | Connection through hole |
| 14 | Redistribution layer |
| 141 | Insulation layer |
| 142 | Metal wire layer |
| 15 | Electrical connection structure |
| 16 | Second plastic encapsulation material layer |

-continued

| Description of Component Reference Numerals | |
|---|---|
| 17 | Antenna structure |
| 171 | Metal antenna layer |
| 1711 | Antenna unit |
| 172 | First metal lead |
| 173 | Dielectric layer |
| 18 | Solder bump |

DETAILED DESCRIPTION OF THE PREFERRED EMBODIMENTS

Implementations of the present disclosure are described below with reference to particular specific embodiments. A person skilled in the art may easily learn the advantages and the effects of the present disclosure according to content disclosed in this specification. The present disclosure may be implemented or applied by using other different specific implementations. Details of this specification may be modified or changed based on different views and application without departing from the spirit of the present disclosure.

Referring to FIG. 1 to FIG. 17. It should be noted that the drawings provided in this embodiment describes the basic idea of the present disclosure only schematically. The drawings merely show components related to the present disclosure and are not drawn according to the number, shapes, and sizes of components during actual implementation. The forms, number, and proportions may be arbitrarily changed, and the distribution forms of the components may be more complex.

Embodiment 1

Figure 1:
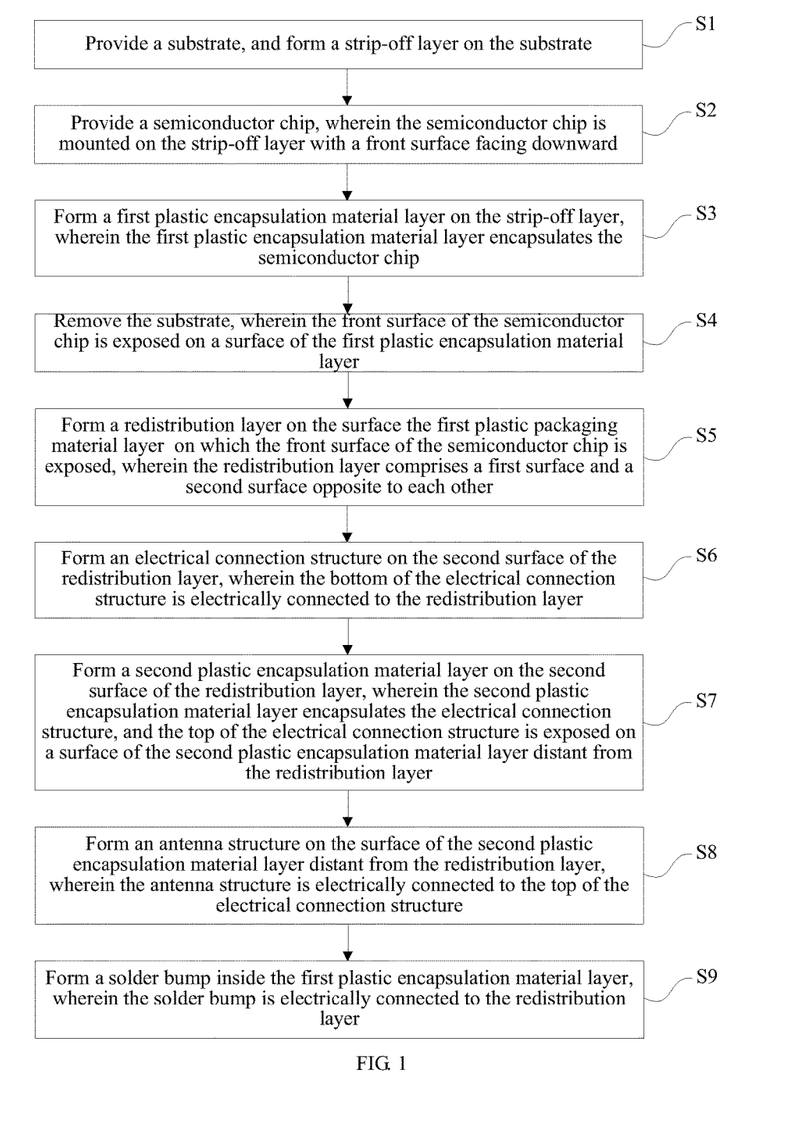
FIG. 1 illustrates a flowchart of a method for manufacturing a double-sided plastic fan-out package structure having an antenna structure according to Embodiment 1 of the present disclosure.

Referring to FIG. 1, this embodiment provides a method for manufacturing a double-sided plastic fan-out package structure having an antenna structure. The method comprises the following steps:

Provide a substrate, and form a strip-off layer on the substrate.

2) Provide a semiconductor chip, and invertedly mount the semiconductor chip on the strip-off layer with a front surface facing downwards.

3) Form a first plastic encapsulation material layer on the strip-off layer, wherein the first plastic encapsulation material layer encapsulates the semiconductor chip.

4) Remove the substrate, wherein the front surface of the semiconductor chip is exposed on a surface of the first plastic encapsulation material layer.

5) Form a redistribution layer on the surface of the first plastic encapsulation material layer on which the front surface of the semiconductor chip is exposed, wherein the redistribution layer comprises a first surface and a second surface opposite to each other, and the first surface of the redistribution layer is in contact with a surface of the first plastic encapsulation material layer.

6) Form an electrical connection structure on the second surface of the redistribution layer, wherein the bottom of the electrical connection structure is electrically connected to the redistribution layer.

7) Form a second plastic encapsulation material layer on the second surface of the redistribution layer, wherein the second plastic encapsulation material layer encapsulates the electrical connection structure, and the top of the electrical connection structure is exposed on the surface of the second plastic packaging material layer which is distant from the redistribution layer.

8) Form an antenna structure on the surface of the second plastic encapsulation material layer which is distant from the redistribution layer, wherein the antenna structure is electrically connected to the top of the electrical connection structure.

9) Form a solder bump inside the first plastic encapsulation material layer, wherein the solder bump is electrically connected to the redistribution layer.

Figure 2:
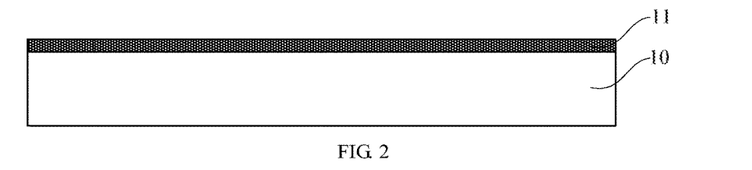

In step 1), referring to step S1 in FIG. 1, and FIG. 2, a substrate 10 is provided, and a strip-off layer 11 is formed on the substrate 10.

As an example, a material of the substrate 10 may be composite materials comprise one or two of silicon, glass, monox, ceram, polymer, and metal, and a shape thereof may be a circle, a square, or any other shape required. In this embodiment, the substrate 10 is used to prevent the semiconductor chip from cracking, warping or breakage in subsequent manufacturing process.

As an example, the strip-off layer 11 serves as a separation layer located between a subsequently formed semiconductor chip 12, a first plastic packaging material layer 13 and the substrate 10 in a subsequent process, the strip-off layer 11 is preferably made of a binding material having a smooth surface, and needs to have a binding force with the semiconductor chip 12 and the first plastic encapsulation material layer 13, so as to ensure that the semiconductor chip 12 and the first plastic encapsulation material layer 13 do not move in the subsequent process. In addition, the strip-off layer 11 also has a relatively strong binding force with the substrate 10. Generally, the binding force between the strip-off layer 11 and the substrate 10 needs to be greater than the binding force between the strip-off layer 11 and the semiconductor chip 12, the first plastic encapsulation material layer 13. As an example, the material of the strip-off layer 11 may be a double-sided tape, adhesive glue made by using a spin-coating process, or the like. The tape is preferably an ultraviolet (UV) tape, which is very easily removed after being exposed to the UV light. In other implementations, the strip-off layer 11 may alternatively be other material layer, such as epoxy, silicone rubber, polyimide (PI), polybenzoxazole (PBO), or benzocyclobutene (BCB), formed by means of physical vapor deposition (PVD) or chemical vapor deposition (CVD), etc. When subsequently separating the substrate 10, the strip-off layer 11 may be removed by using a method such as wet etching, chemical mechanical polishing, or tearing off etc.

Figure 3:
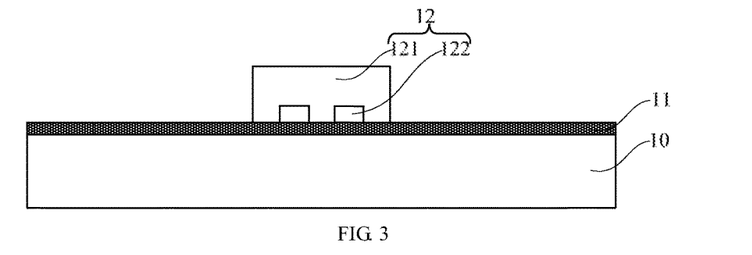

In step 2), referring to step S2 in FIG. 1, and FIG. 3, the semiconductor chip 12 is provided, and the semiconductor chip 12 is invertedly mounted on the strip-off layer 11 with a front surface facing downwards.

As an example, the semiconductor chip 12 is mounted on the strip-off layer 11 by using a bond-on-trace technology. The front surface of the semiconductor chip 12 is in contact with a surface of the peel-off layer 11. The bond-on-trace technology is known to a person skilled in the art, and is not described herein.

As an example, the semiconductor chip 12 may be any existing semiconductor chip. The semiconductor chip 12 comprises a bare chip 121 and a connection pad 122 located inside the bare chip 121. A functional device may be formed inside the bare chip 121. The connection pad 122 is electrically connected to the functional device located inside the bare chip 121. A surface the connection pad 122 located is the front surface of the semiconductor chip 12.

Figure 4:
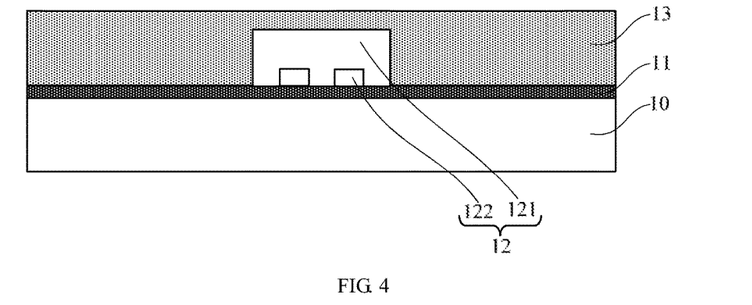

In step 3), referring to step S3 in FIG. 1, and FIG. 4, the first plastic encapsulation material layer 13 is formed on the strip-off layer 11, and the first plastic encapsulation material layer 13 encapsulates the semiconductor chip 12.

As an example, the plastic encapsulation material layer 13 may be formed on the upper surface of the strip-off layer 11 by using a process like, for example, a compression molding process, a transfer molding process, a liquid encapsulation molding process, a molded underfill process, a wicking underfill process, a vacuum lamination process, or a spin coating process.

As an example, the material of the first plastic encapsulation material layer 13 may be, but is not limited to, PI, silica gel, epoxy resin, a curable polymer matrix material, a curable resin matrix material, or the like.

For example, the thickness of the first plastic encapsulation material layer 13 may be greater than the thickness of the semiconductor chip 12. In this case, an upper surface of the first plastic encapsulation material layer 13 is higher than an upper surface of the semiconductor chip 12. Certainly, the thickness of the first plastic encapsulation material layer 13 may alternatively be equal to the thickness of the semiconductor chip 12. In this case, the upper surface of the first plastic encapsulation material layer 13 is aligned with the upper surface of the semiconductor chip 12. For example, in FIG. 4, the thickness of the first plastic encapsulation material layer 13 may be greater than the thickness of the semiconductor chip 12.

Figure 5:
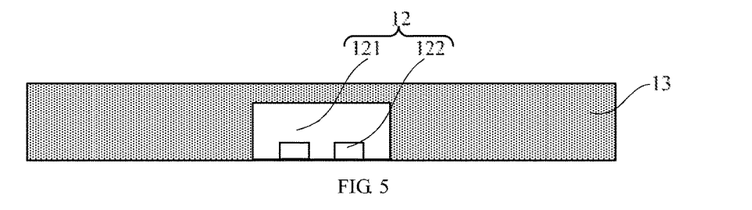

In step 4), referring to step S4 in FIG. 1, and FIG. 5, the substrate 10 is removed, and the front surface of the semiconductor chip 12 is exposed on a surface of the first plastic encapsulation material layer 13.

For example, the substrate 10 and the strip-off layer 11 may be removed by using a grinding process, a thinning process, or the like. Preferably, in this embodiment, the strip-off layer 11 is a UV tape, and the substrate 10 may be removed in a manner of tearing off the strip-off layer 11.

Figure 6:
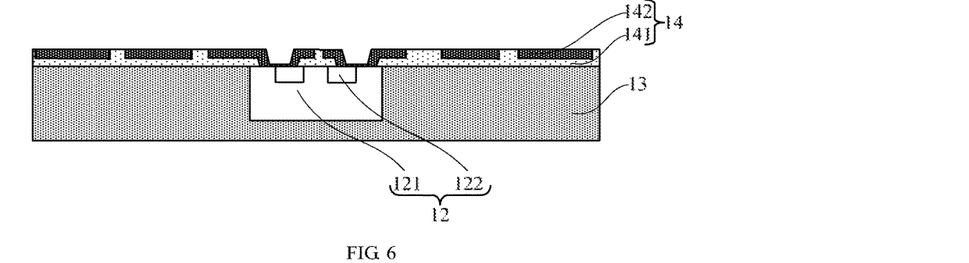

In step 5), referring to step S5 in FIG. 1, and FIG. 6, the redistribution layer 14 is formed on the surface of the first plastic encapsulation material layer 13 on which the front surface of the semiconductor chip 12 is exposed. The redistribution layer 14 comprises the first surface and the second surface opposite to each other, and the first surface of the redistribution layer 14 is in contact with the surface of the first plastic encapsulation material layer 13.

For example, as shown in FIG. 6, the redistribution layer 14 comprises an insulation layer 141 and a metal wire layer 142. Forming the redistribution layer 14 on the surface of the first plastic encapsulation material layer 13 on which the front surface of the semiconductor chip 12 is exposed comprises the following steps:

5-1) forming the insulation layer 141 on the surface of the first plastic encapsulation material layer 13 on which the front surface of the semiconductor chip 12 is exposed, and forming a slot inside the insulation layer 141 by using a photolithography process and an etching process, wherein the slot defines a location and a shape of the metal wire layer 142; and 5-2) forming the metal wire layer 142 inside the slot.

In another example, the redistribution layer 14 comprises at least two metal wire layers 142 and at least one insulation layer 141. Forming the redistribution layer 14 on the surface of the first plastic encapsulation material layer 13 on which the front surface of the semiconductor chip 12 is exposed comprises the following steps:

5-1) forming a first metal wire layer 142 on the surface of the first plastic encapsulation material layer 13 on which the front surface of the semiconductor chip 12 is exposed;

5-2) forming a first insulation layer 141 on the surface of the first plastic encapsulation material layer 13 on which the front surface of the semiconductor chip 12 is exposed, wherein the first insulation layer 141 encapsulates the first metal wire layer 142, and an upper surface of the first insulation layer 141 is higher than an upper surface of the first metal wire layer 142; and 5-3) forming, inside the first insulation layer 141, several other metal wire layers 142 that are electrically connected to the first metal wire layer 142 and are stacked and spaced, wherein adjacent metal wire layers 142 are electrically connected by using a metal plug.

For example, in the foregoing example, the material of the metal wire layer 142 may be, but is not limited to, one or two of copper, aluminum, nickel, gold, silver, and titanium or a composite material of more than two materials, and the metal wire layer 142 may be formed by using a process such as PVD, CVD, sputtering, electroplating, or chemical plating. The material of the insulation layer 141 may be a low-k dielectric material. Specifically, the insulation layer 141 may be made of one material of epoxy resin, silica gel, PI, PBO, BCB, monox, phosphorosilicate glass, and fluoric glass, and may be formed by using a process such as spin-coating, CVD, or plasma enhanced CVD.

Figure 7:
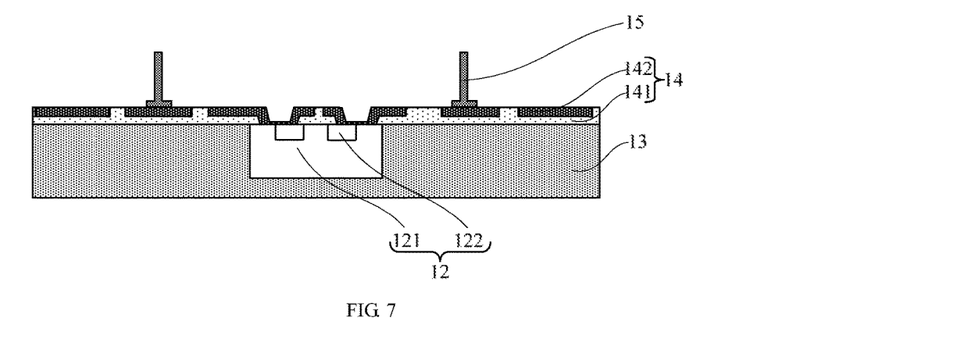

In step 6), referring to step S6 in FIG. 1, and FIG. 7, the electrical connection structure 15 is formed on the second surface of the redistribution layer 14, wherein the bottom of the electrical connection structure 15 is electrically connected to the redistribution layer 14.

For example, the electrical connection structure 15 may be a metal wire, a metal rod, or the like. Preferably, in this embodiment, the electrical connection structure 15 is a metal wire. A metal wire may be formed on the second surface of the redistribution layer 14 by using a wire-bonding process, to serve as the electrical connection structure 15.

For example, the electrical connection structure 15 may be a metal connection line of any metal material. Preferably, in this embodiment, the material of the electrical connection structure 15 may be copper, silver, nickel, aluminum, tin, or the like.

Figure 8:
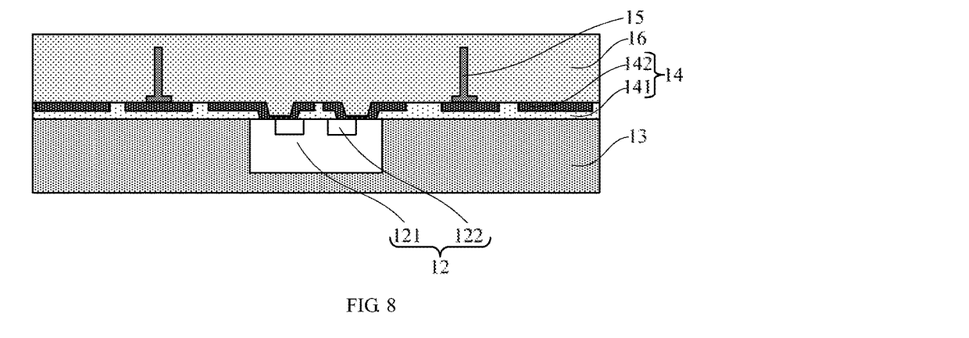
Figure 9:
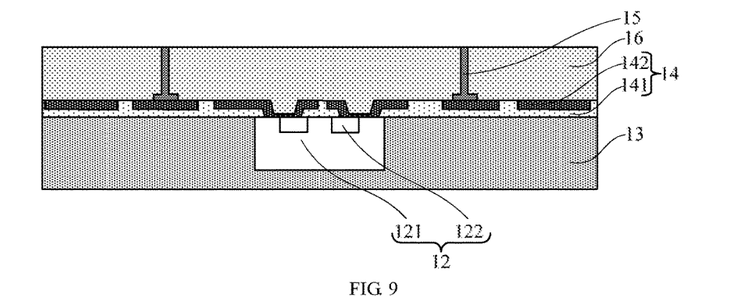

In step 7), referring to step S7 in FIG. 1, FIG. 8 and FIG. 9, the second plastic encapsulation material layer 16 is formed on the second surface of the redistribution layer 14, the second plastic encapsulation material layer 16 encapsulates the electrical connection structure 15, and the surface of second plastic encapsulation material layer 16 distant from the redistribution layer 14 exposes the top of the electrical connection structure 15.

For example, the second plastic encapsulation material layer 16 may be formed on the second surface of the redistribution layer 14 by using the compression molding process, the transfer molding process, the liquid encapsulation molding process, the molded underfill process, the wicking underfill process, the vacuum lamination process, or the spin coating process.

For example, the material of the second plastic encapsulation material layer 16 may be, but is not limited to, PI, silica gel, epoxy resin, a curable polymer matrix material, a curable resin matrix material, or the like.

In an example, the height of the initially formed second plastic encapsulation material layer 16 is greater than the height of the electrical connection structure 15, that is, the second plastic packaging material layer 16 completely encapsulates the electrical connection structure 15, as shown in FIG. 8. Then, a part of second plastic encapsulation material layer 16 is removed by using a process such as chemical mechanical polishing, so that the upper surface of the second plastic encapsulation material layer 16 is aligned with the top of the electrical connection structure 15, as shown in FIG. 9.

In another example, the second plastic packaging material layer 16 may be formed based on the top of the electrical connection structure 15, so that the height of the formed second plastic packaging material layer 16 is the same as the height of the electrical connection structure 15. In this way, a process of polishing the second plastic encapsulation material layer 16 may be saved, thereby reducing the process steps and costs.

In step 8), referring to step S8 in FIG. 1, and FIG. 10 to FIG. 14, the antenna structure 17 is formed on the surface of the second plastic encapsulation material layer 16 distant from the redistribution layer 14, and the antenna structure 17 is electrically connected to the top of the electrical connection structure 15.

Figure 10:
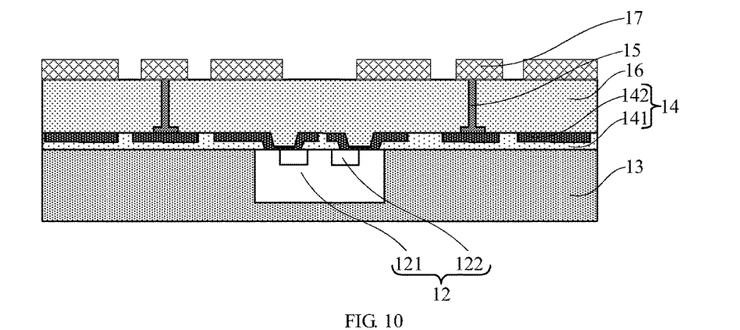

In an example, as shown in FIG. 10, the antenna structure 17 comprises a metal antenna layer 171. In this case, a specific method of forming the antenna structure 17 on the surface of the second plastic encapsulation material layer 16 distant from the redistribution layer 14 is: first, forming a metal layer on the surface of the second plastic packaging material layer 16 distant from the redistribution layer 14; and then, patterning the metal layer by using a photolithography and etching process to obtain the metal antenna layer 171, and using the metal antenna layer 171 as the antenna structure 17.

Figure 11:
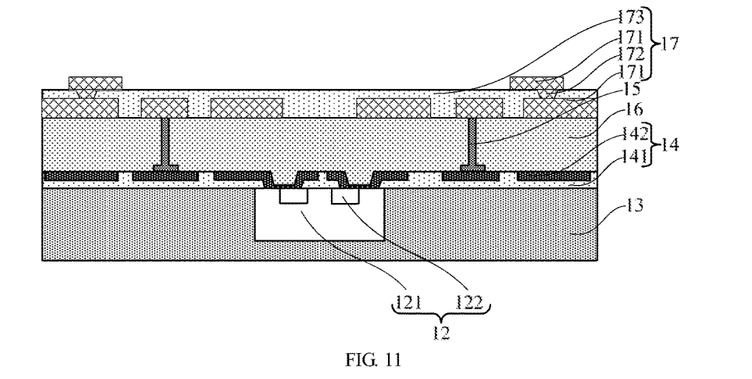

In another example, as shown in FIG. 11, the antenna structure 17 comprises two metal antenna layers 171 and one dielectric layer 173, and the two adjacent metal antenna layers 171 are electrically connected by using a metal lead 172. In this case, the forming the antenna structure 17 on the surface of the second plastic packaging material layer and that is distant from the redistribution layer 14 comprises the following steps:

8-1) forming a first metal antenna layer 171 on the surface of the second plastic encapsulation material layer 16 distant from the redistribution layer 14;

8-2) forming a first metal lead 172 on the first metal antenna layer 171, wherein the bottom of the first metal lead 172 is electrically connected to the first metal antenna layer 171;

8-3) forming a first dielectric layer 173 on the surface of the second plastic encapsulation material layer 16 distant from the redistribution layer 14, wherein the first dielectric layer 173 completely covers the first metal antenna layer 171 and the first metal lead 172, and the top of the first dielectric layer 173 is aligned with the top of the first metal lead 172; and 8-4) forming a second metal antenna layer 171 on a surface of the first dielectric layer 173.

In still another example, the antenna structure 17 comprises three metal antenna layers 171 and two dielectric layers 173, and two adjacent metal antenna layers 171 are electrically connected by using a metal lead 172. In this case, after step 8-4), the method further comprises the following steps:

8-5) forming a second metal lead on the second metal antenna layer 171 formed in step 8-4), wherein the bottom of the second metal lead is electrically connected to the second metal antenna layer 171 formed in step 8-4);

8-6) forming a second dielectric layer 173 on the surface of the first dielectric layer 173 formed in step 8-3), wherein the second dielectric layer 173 completely covers the second metal antenna layer 171 formed in step 8-5) and the second metal lead formed in step 8-5), and the top of the medium layer 173 formed in this step is aligned with the top of the second metal lead; and 8-7) forming a third metal antenna layer 171 on a surface of the second dielectric layer 173 formed in step 8-6).

In still another example, the antenna structure 17 comprises at least three metal antenna layers 171 and at least two dielectric layers 173, and two adjacent metal antenna layers 171 are electrically connected by using a metal lead 172. In this case, after step 8-7), the method further comprises repeating step 8-5) to step 8-7) at least once. When the antenna structure 17 comprises at least two metal antenna layers 171, two adjacent metal antenna layers 171 are electrically connected by using a metal lead. Compared with a metal rod electrical connection structure, the manufacturing costs can be obviously reduced.

Figure 12:
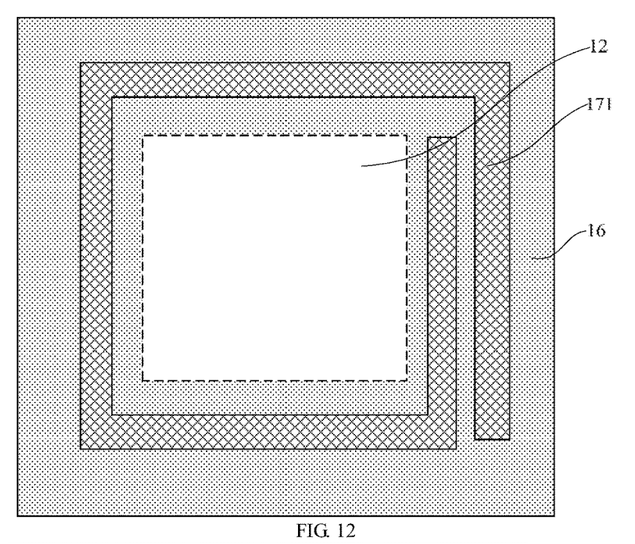

In an example, as shown in FIG. 12, FIG. 12 is a schematic top view of FIG. 10 and FIG. 11. Regardless of the number of the metal antenna layers 171 is one or two, the metal antenna layer 171 is always a helical antenna. The shape of the helical antenna may be a rectangular spiral or a circular spiral. For example, in FIG. 12, the shape of the helical antenna is a rectangular spiral. An orthographic projection of the helical antenna on a surface on which the semiconductor chip 12 is located is located on a periphery of the semiconductor chip 12. That is, as shown in FIG. 12, the semiconductor chip 12 is located on an inner side of the helical antenna.

Figure 13:
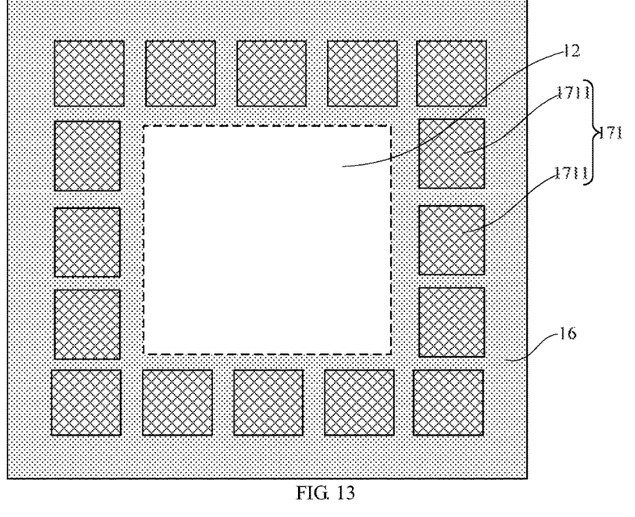
Figure 14:
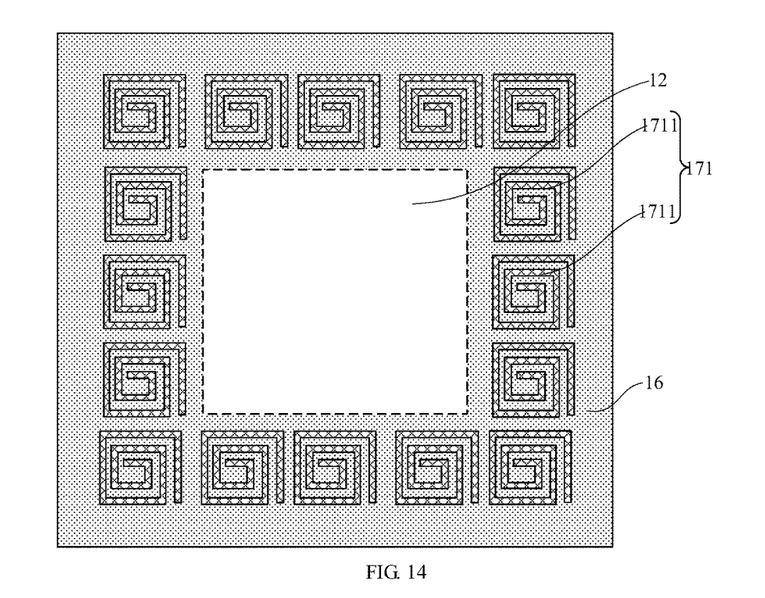

In still another example, as shown in FIG. 13 and FIG. 14, FIG. 13 and FIG. 14 are schematic top views of FIG. 10 and FIG. 11 in different examples. Regardless of the number of the metal antenna layers 171 is one or at least two, each metal antenna layer 171 comprises a plurality of antenna units 1711. The plurality of antenna units 1711 is arranged in a circle in a direction parallel to the surface of the second plastic encapsulation material layer 16 from redistribution layer 14. That is, the plurality of antenna units 1711 on each metal antenna layer 171 forms a circle, and an orthographic projection of the metal antenna layer 171 on the surface on which the semiconductor chip 12 is located is located on the periphery of the semiconductor chip 12. That is, the semiconductor chip 12 is located on an inner side of the circular metal antenna layer 171 formed by the antenna units 1711. The antenna units 1711 may be block antennas shown in FIG. 13, or may be helical antennas shown in FIG. 14. In this case, the helical antennas may be rectangular helical antennas shown in FIG. 14, or may be circular helical antennas or the like.

For example, in the foregoing examples, the material of the dielectric layer 173 may comprise, but is not limited to, silicon dioxide or polyethylene glycol terephthalate (PET), and the dielectric layer 173 is obtained by using a process such as spin-coating, CVD, or plasma enhanced CVD. The materials of the metal antenna layer 171 and the metal lead may comprise, but are not limited to, one or at least two of copper, aluminum, nickel, gold, silver, tin, and titanium. The metal antenna layer 171 and the metal lead may be obtained by using one process of PVD, CVD, sputtering, electroplating, or chemical plating.

In step 9), referring to step S9 in FIG. 1, and FIG. 15 to FIG. 17, a solder bump 18 is formed inside the first plastic encapsulation material layer 13, and the solder bump 18 is electrically connected to the redistribution layer 14.

Figure 15:
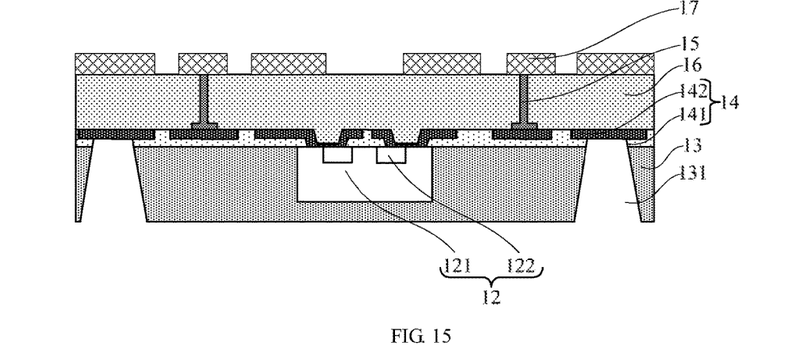

For example, the forming a solder bump 18 inside the first plastic encapsulation material layer 13 comprises the following steps:

9-1) forming a connection through hole 131 inside the first plastic encapsulation material layer 13 by using a photolithography process and an etching process, wherein the first surface of the redistribution layer 14 is partially exposed on the connection through hole 131, and as shown in FIG. 15, the connection through hole 131 is located on an outer side of the semiconductor chip 12; and 9-2) forming the solder bump 18 inside the connection through hole 131, wherein the solder bump 18 is electrically connected to the redistribution layer 14.

In an example, forming a solder bump 18 inside the connection through hole 131 comprises the following steps:

9-2-1) forming a metal rod inside the connection through hole 131, wherein the metal rod fully fills the connection through hole 131; and 9-2-2) forming a solder ball on a surface of the metal rod.

For example, the material of the metal rod may be one of copper, aluminum, nickel, gold, silver, and titanium, or a composite material of two or more materials. The metal rod may be formed by using any process of PVD, CVD, sputtering, electroplating, or chemical plating. The material of the solder ball may be one of copper, aluminum, nickel, gold, silver, and titanium, or a composite material of two or more materials. The solder ball may be formed by using a soldering reflow process.

Figure 16:
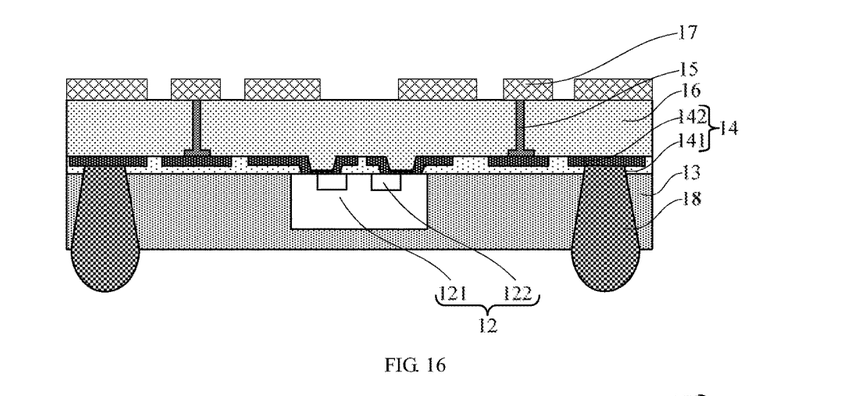
FIG. 16 and FIG. 17 illustrate schematic cross sectional views of the double-sided plastic fan-out package structure having an antenna structure consistent with the present disclosure.
Figure 17:
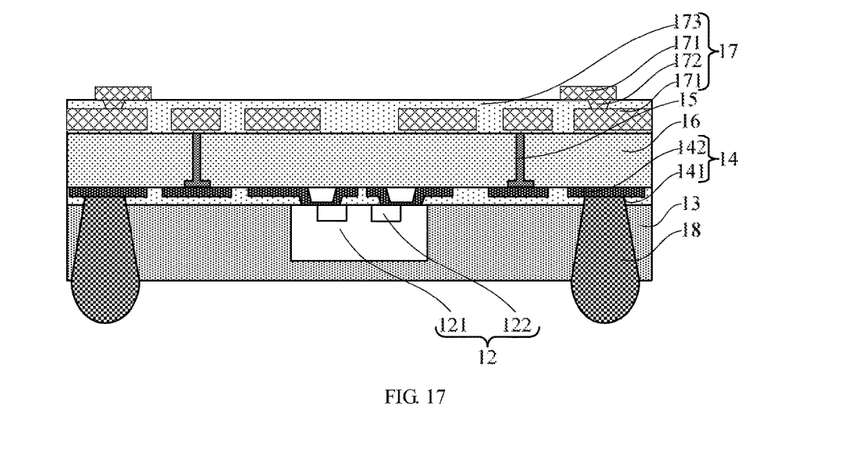

In another example, as shown in FIG. 16 and FIG. 17, the solder bump 18 is a solder ball. The solder ball may be directly formed by using the soldering reflow process and is used as the solder bump 18.

Embodiment 2

Still referring to FIG. 16 and FIG. 17 with reference to FIG. 12 to FIG. 14, this embodiment further provides a double-sided plastic fan-out package structure having an antenna structure. The double-sided plastic fan-out package structure having an antenna structure may be manufactured by using, but not limited to, the manufacturing method in Embodiment 1. The double-sided plastic fan-out package structure having an antenna structure comprises: a redistribution layer 14, wherein the redistribution layer 14 comprises a first surface and a second surface opposite to each other; a semiconductor chip 12, wherein the semiconductor chip 12 is invertedly mounted on the first surface of the redistribution layer 14 with a front surface facing downward, and is electrically connected to the redistribution layer 14; a first plastic encapsulation material layer 13, wherein the first plastic encapsulation material layer 13 is located on the first surface of the redistribution layer 14, and encapsulates the semiconductor chip 12; a second plastic packaging material layer 16, wherein the second plastic encapsulation material layer 16 is located on the second surface of the redistribution layer 14; an antenna structure 17, wherein the antenna structure 17 is located on a surface of the second plastic encapsulation material layer 16 distant from the redistribution layer 14; an electrical connection structure 15, wherein the electrical connection structure 15 is located inside the second plastic encapsulation material layer 16, one end of the electrical connection structure 15 is electrically connected to the redistribution layer 14, and the other end of the electrical connection structure 15 is electrically connected to the antenna structure 17; a connection through hole, wherein the connection through hole is located inside the first plastic encapsulation material layer 13, and the first surface of the redistribution layer 14 is partially exposed on the connection through hole; and a solder bump 18, wherein the solder bump 18 is located inside the connection through hole, and is electrically connected to the redistribution layer 14.

In an example, as shown in FIG. 16 and FIG. 17, the redistribution layer 14 comprises an insulation layer 141 and a metal wire layer 142. The metal wire layer 142 is located inside the insulation layer 141. Certainly, in another example, the redistribution layer 14 may alternatively be of a stacked structure comprising at least two metal wire layers 142 and at least one insulation layer 141.

For example, the material of the metal wire layer 142 may be, but is not limited to, one of copper, aluminum, nickel, gold, silver, and titanium or a composite material of two or more materials, and the metal wire layer 142 may be formed by using a process such as PVD, CVD, sputtering, electroplating, or chemical plating. The material of the insulation layer 141 may be a low-k dielectric material.

For example, the semiconductor chip 12 may be any existing semiconductor chip. The semiconductor chip 12 comprises a bare chip 121 and a connection pad 122 located inside the bare chip 121. A functional device may be formed inside the bare chip 121. The connection pad 122 is electrically connected to the functional device located inside the bare chip 121. A surface on which the connection pad 122 is located is the front surface of the semiconductor chip 12.

For example, the material of the first plastic encapsulation material layer 13 may be, but is not limited to, PI, silica gel, epoxy resin, a curable polymer matrix material, a curable resin matrix material, or the like.

For example, the thickness of the first plastic encapsulation material layer 13 may be greater than the thickness of the semiconductor chip 12. In this case, an upper surface of the first plastic encapsulation material layer 13 is higher than an upper surface of the semiconductor chip 12. Certainly, the thickness of the first plastic packaging material layer 13 may alternatively be equal to the thickness of the semiconductor chip 12. In this case, the upper surface of the first plastic encapsulation material layer 13 is aligned with the upper surface of the semiconductor chip 12. For example, in FIG. 16 and FIG. 17, the thickness of the first plastic encapsulation material layer 13 may be greater than the thickness of the semiconductor chip 12.

For example, the material of the second plastic packaging material layer 16 may be, but is not limited to, PI, silica gel, epoxy resin, a curable polymer matrix material, a curable resin matrix material, or the like. The surface of the second plastic encapsulation material layer 16 distant from the redistribution layer 14 is aligned with a surface that is of the electrical connection structure 15 and that is distant from the redistribution layer 14.

In an example, as shown in FIG. 16, the antenna structure 17 comprises a metal antenna layer 171.

In another example, as shown in FIG. 17, the antenna structure 17 comprises two metal antenna layers 171 stacked and spaced in a vertical direction, a first metal lead 172, and a dielectric layer 173. The two adjacent metal antenna layers 171 are electrically connected by using a second metal lead 172. Certainly, in another example, the antenna structure 17 may alternatively comprise at least two metal antenna layers 171 stacked and spaced in the vertical direction and at least two dielectric layers 173. The dielectric layer 173 is located between adjacent metal antenna layers 171. The adjacent metal antenna layers 171 are electrically connected by using a metal lead.

In an example, regardless of the number of the metal antenna layers 171 is one or two, the metal antenna layer 171 is always a helical antenna. The shape of the helical antenna may be a rectangular spiral or a circular spiral. For example, in FIG. 12, the shape of the helical antenna is a rectangular spiral. An orthographic projection of the helical antenna on a surface on which the semiconductor chip 12 is located is located on a periphery of the semiconductor chip 12. That is, as shown in FIG. 12, the semiconductor chip 12 is located on an inner side of the helical antenna.

In still another example, as shown in FIG. 13 and FIG. 14, FIG. 13 and FIG. 14 are schematic top views of FIG. 10 and FIG. 11 in different examples. Regardless of the number of the metal antenna layers 171 is one or at least two, each metal antenna layer 171 comprises a plurality of antenna units 1711. The plurality of antenna units 1711 is arranged in a circle in a direction parallel to the surface of the second plastic packaging material layer 16 distant from the redistribution layer 14. That is, the plurality of antenna units 1711 on each metal antenna layer 171 forms a circle, and an orthographic projection of the metal antenna layer 171 on the surface on which the semiconductor chip 12 is located is located on the periphery of the semiconductor chip 12. That is, the semiconductor chip 12 is located on an inner side of the circular metal antenna layer 171 formed by the antenna units 1711. The antenna units 1711 may be block antennas shown in FIG. 13, or may be helical antennas shown in FIG. 14. In this case, the helical antennas may be rectangular helical antennas shown in FIG. 14, or may be circular helical antennas or the like.

For example, in the foregoing examples, the material of the dielectric layer 173 may comprise, but is not limited to, silicon dioxide or PET, and the dielectric layer 173 is obtained by using a process such as spin-coating, CVD, or plasma enhanced CVD. The materials of the metal antenna layer 171 and the metal lead may comprise, but are not limited to, one or at least two of copper, aluminum, nickel, gold, silver, tin, and titanium. The metal antenna layer 171 and the metal lead may be obtained by using one process of PVD, CVD, sputtering, electroplating, or chemical plating.

For example, the electrical connection structure 15 is a metal lead.

In an example, the solder bump 18 comprises: a metal rod, wherein the metal rod is located inside the connection through hole inside the first plastic encapsulation material layer 13, and is electrically connected to the redistribution layer 14; and a solder ball, wherein the solder ball is located on a surface of the metal rod. The material of the metal rod may be one of copper, aluminum, nickel, gold, silver, and titanium, or a composite material of two or more materials. The metal rod may be formed by using any process of PVD, CVD, sputtering, electroplating, and chemical plating. The material of the solder ball may be one of copper, aluminum, nickel, gold, silver, and titanium, or a composite material of two or more materials. The solder ball may be formed by using a soldering reflow process.

In another example, the solder bump 18 is a solder ball.

In conclusion, according to the double-sided plastic fan-out package structure having an antenna structure and the manufacturing method thereof provided in the present disclosure, the double-sided plastic fan-out package structure having an antenna structure comprises: a redistribution layer, comprising a first surface and a second surface opposite to each other; a semiconductor chip, invertedly mounted on the first surface of the redistribution layer with a front surface facing downward, and electrically connected to the redistribution layer; a first plastic encapsulation material layer, located on the first surface of the redistribution layer, and encapsulates the semiconductor chip; a second plastic encapsulation material layer, located on the second surface of the redistribution layer; an antenna structure, located on a surface of the second plastic encapsulation material layer distant from the redistribution layer; an electrical connection structure, located inside the second plastic encapsulation material layer, wherein one end of the electrical connection structure is electrically connected to the redistribution layer, and the other end of the electrical connection structure is electrically connected to the antenna structure; a connection through hole, located inside the first plastic encapsulation material layer, and on which the first surface of the redistribution layer is partially exposed; and a solder bump, located inside the connection through hole, and electrically connected to the redistribution layer. The semiconductor chip and the antenna structure in the double-sided plastic fan-out package structure having an antenna structure consistent with the present disclosure are respectively located on an upper side and a lower side of the redistribution layer, and a metal wire layer in the redistribution layer can shield an interference signal of the antenna structure, thereby preventing the antenna structure from interfering the semiconductor chip; the metal lead formed by the antenna structure and the redistribution layer by using the electrical connection structure and a wiring process can effectively reduce the costs, and effectively shorten the spacing between the antenna structure and the redistribution layer, thereby improving the component performance; the double-sided plastic fan-out package structure having an antenna structure consistent with the present disclosure further has an advantage of a small size.

The foregoing embodiments are merely used to illustrate the principle and the effect of the present application, but are not intended to limit the present application. Any person skilled in the art may modify or change the foregoing embodiments without departing from the spirit and scope of the present application. Accordingly, all equivalent modifications and variations completed by a person of ordinary skill in the art should fall within the scope of the present application defined by the appended claims.

What is claimed is:

1. A method for manufacturing a double-sided plastic fan-out package structure having an antenna structure, comprising the following steps:
   1) providing a substrate, and forming a strip-off layer on the substrate;
   2) providing a semiconductor chip, and invertedly mounting the semiconductor chip on the strip-off layer with a front surface facing the strip-off layer;
   3) forming a first plastic encapsulation material layer on the strip-off layer, wherein the first plastic encapsulation material layer encapsulates the semiconductor chip;
   4) removing the substrate, wherein the front surface of the semiconductor chip is exposed on a surface of the first plastic encapsulation material layer;
   5) forming a redistribution layer on the surface of the first plastic encapsulation material layer on which the front face of the semiconductor chip is exposed, wherein the redistribution layer comprises a first surface and a second surface opposite to each other, and the first surface of the redistribution layer is in contact with a surface of the first plastic encapsulation material layer;
   6) forming an electrical connection structure on the second surface of the redistribution layer, wherein one end of the electrical connection structure is electrically connected to the redistribution layer;

7) forming a second plastic encapsulation material layer on the second surface of the redistribution layer, wherein the second plastic encapsulation material layer encapsulates the electrical connection structure, and another end of the electrical connection structure is exposed at the surface of the second plastic encapsulation material layer distant from the redistribution layer;

8) forming an antenna structure on the surface of the second plastic encapsulation material layer distant from the redistribution layer, wherein the antenna structure is electrically connected to the end of the electrical connection structure; and 9) forming a solder bump through the first plastic encapsulation material layer to electrically connect to the redistribution layer.

2. The method for manufacturing a double-sided plastic fan-out package structure having an antenna structure according to claim 1, wherein in step 8), forming the antenna structure on the surface of the second plastic encapsulation material layer distant from the redistribution layer further comprises: forming a metal antenna layer on the surface of the second plastic encapsulation material layer distant from the redistribution layer, and using the metal antenna layer as the antenna structure.

3. The method for manufacturing a double-sided plastic fan-out package structure having an antenna structure according to claim 1, wherein in step 8), forming an antenna structure on the surface of the second plastic encapsulation material layer distant from the redistribution layer further comprises the following steps:

8-1) forming a first metal antenna layer on the surface of the second plastic encapsulation material layer distant from the redistribution layer;

8-2) forming a first metal lead on the first metal antenna layer, wherein a bottom of the first metal lead is electrically connected to the first metal antenna layer;

8-3) forming a first dielectric layer on the surface of the second plastic encapsulation material layer distant from the redistribution layer, wherein the first dielectric layer completely covers the first metal antenna layer and the first metal lead, and a top of the first dielectric layer is aligned with a top of the first metal lead; and 8-4) forming a second metal antenna layer on the top surface of the first dielectric layer.

4. The method for manufacturing a double-sided plastic fan-out package structure having an antenna structure according to claim 3, wherein after step 8-4), the method further comprises the following steps:

8-5) forming a second metal lead on the second metal antenna layer formed in step 8-4), wherein the bottom of the second metal lead is electrically connected to the second metal antenna layer formed in step 8-4);

8-6) forming a second dielectric layer on the surface of the first dielectric layer formed in step 8-3), wherein the second dielectric layer completely covers the second metal antenna layer formed in step 8-5) and the second metal lead formed in step 8-5), and a top of the second dielectric layer formed in this step is aligned with the top of the second metal lead; and 8-7) forming a third metal antenna layer on the top surface of the second dielectric layer formed in step 8-6).

5. The method for manufacturing a double-sided plastic fan-out package structure having an antenna structure according to claim 4, wherein after step 8-7), the method further comprises: repeating step 8-5) to step 8-7) at least once.

6. The method for manufacturing a double-sided plastic fan-out package structure having an antenna structure according to claim 5, wherein the first, the second and the third metal antenna layers are helical antennas, and wherein a perpendicular projections of said metal antenna layers on the first surface of the RDL are located at a periphery area of the semiconductor chip.

7. The method for manufacturing a double-sided plastic fan-out package structure having an antenna structure according to claim 5, wherein each of the first, the second and the third metal antenna layers comprises a plurality of antenna units, wherein the plurality of antenna units is arranged in a circle in a plane parallel to the surface of the second plastic encapsulation material layer distant from the redistribution layer, and wherein a perpendicular projection of said metal antenna layer on the first surface of the RDL is located at a periphery area of the semiconductor chip.

8. The method for manufacturing a double-sided plastic fan-out package structure having an antenna structure according to claim 7, wherein the antenna units comprise block antennas or helical antennas.

9. The method for manufacturing a double-sided plastic fan-out package structure having an antenna structure according to claim 1, wherein step 9) of forming a solder bump through the first plastic encapsulation material layer comprises the following steps:

9-1) forming a hole through the first plastic encapsulation material layer, wherein the first surface of the redistribution layer is partially exposed to the hole; and 9-2) forming the solder bump inside the hole, wherein the solder bump is electrically connected to the redistribution layer.

* * * * *